(12) United States Patent
Rao et al.

(10) Patent No.: US 12,130,692 B2
(45) Date of Patent: *Oct. 29, 2024

(54) LOW POWER STATE SELECTION BASED ON IDLE DURATION HISTORY

(71) Applicants: ADVANCED MICRO DEVICES, INC., Santa Clara, CA (US); ATI TECHNOLOGIES ULC, Markham (CA)

(72) Inventors: Karthik Rao, Austin, TX (US); Indrani Paul, Austin, TX (US); Donny Yi, Austin, TX (US); Oleksandr Khodorkovsky, Markham (CA); Leonardo De Paula Rosa Piga, Austin, TX (US); Wonje Choi, Austin, TX (US); Dana G. Lewis, Austin, TX (US); Sriram Sambamurthy, Austin, TX (US)

(73) Assignees: Advanced Micro Devices, Inc., Santa Clara, CA (US); ATI TECHNOLOGIES ULC, Markham (CA)

( * ) Notice: Subject to any disclaimer, the term of this patent is extended or adjusted under 35 U.S.C. 154(b) by 0 days.

This patent is subject to a terminal disclaimer.

(21) Appl. No.: 17/993,562

(22) Filed: Nov. 23, 2022

(65) Prior Publication Data

US 2023/0088994 A1    Mar. 23, 2023

Related U.S. Application Data

(63) Continuation of application No. 17/219,097, filed on Mar. 31, 2021, now Pat. No. 11,543,877.

(51) Int. Cl.
G06F 1/32      (2019.01)
G06F 1/3287    (2019.01)

(52) U.S. Cl.
CPC .................................. *G06F 1/3287* (2013.01)

(58) Field of Classification Search
CPC ..................................................... G06F 1/3287
See application file for complete search history.

(56) References Cited

U.S. PATENT DOCUMENTS

| | | | |
|---|---|---|---|
| 2009/0158067 A1* | 6/2009 | Bodas | G06F 1/3203 713/323 |
| 2015/0121057 A1* | 4/2015 | Arora | G06F 1/3287 713/100 |
| 2017/0228196 A1* | 8/2017 | Alavoine | G06F 3/0673 |

OTHER PUBLICATIONS

International Preliminary Report on Patentability issued in Application No. PCT/US2022/022359 mailed Oct. 13, 2023, 7 pages.

\* cited by examiner

*Primary Examiner* — Stefan Stoynov

(57) ABSTRACT

An apparatus includes a processor, a sleep state duration prediction module, and a system management unit. The sleep state duration prediction module is configured to predict a sleep state duration for component of the processing device. The system management unit is to transition the component into a sleep state selected from a plurality of sleep states based on a comparison of the predicted sleep state duration to at least one duration threshold. Each sleep state of the plurality of sleep states is a lower power state than a previous sleep state of the plurality of sleep states.

22 Claims, 10 Drawing Sheets

LOW POWER STATE SELECTION BASED ON IDLE DURATION HISTORY

CROSS-REFERENCE TO RELATED APPLICATIONS

The present application is a Continuation application of U.S. patent application Ser. No. 17/219,097, entitled "LOW POWER STATE SELECTION BASED ON IDLE DURATION HISTORY", and filed on Mar. 31, 2021, the entirety of which is incorporated by reference herein.

BACKGROUND

Modern computer systems can typically support several power management states. The working system state generally describes a state where the system is fully usable and fully energized. Under some conditions, such as if some or all of the system components are not being used, power is reduced for some or all of the components by entering a lower power system state from the working state.

BRIEF DESCRIPTION OF THE DRAWINGS

The present disclosure may be better understood, and its numerous features and advantages made apparent to those skilled in the art by referencing the accompanying drawings. The use of the same reference symbols in different drawings indicates similar or identical items.

DETAILED DESCRIPTION

Figure 1:
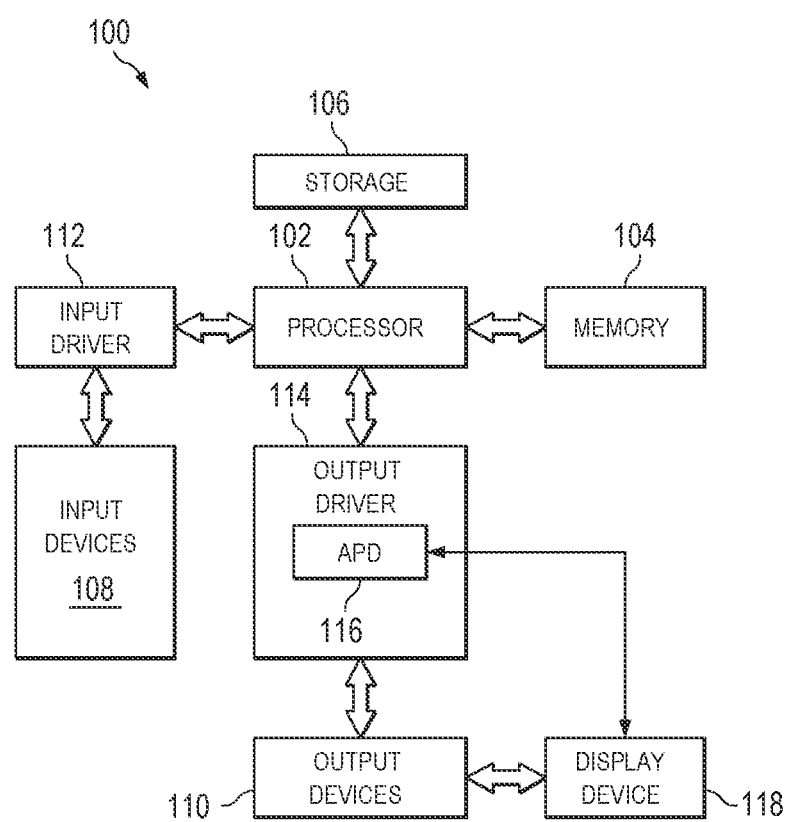
FIG. 1 is a block diagram of an example processing device in accordance with some embodiments.

Components in processing devices, such as central processing units (CPUs), graphics processing units (GPUs), and accelerated processing units (APUs), can be operated in different power management states in which portions of the processing device can be deactivated or run at lower operating frequencies or voltages. For example, the power management states available to a processing device component may include active states, idle states, power-gated states, and so on. In an active state, the component executes instructions and runs at a nominal operating frequency and operating voltage. In an idle state, the component does not execute instructions and can be run at a lower operating frequency or operating voltage. In a power-gated state, the power supply is disconnected from the component by, for example, using a header transistor that interrupts the power supplied to the component when a power-gate signal is applied to a gate of the header transistor. The idle and power-gated states can be referred to as sleep states, and multiple levels of sleep states can be implemented by a processing device. In at least some implementations, while in the lowest (shallowest) sleep state level, a component of a processing device consumes less power than when operating in the active state but consumers more power than the next higher (deeper) sleep state level. When the component is placed in the highest (deepest) sleep state level, the component is typically power-gated.

Processing devices can conserve power by transitioning one or more components from the active state to a sleep state when there are no activities to be performed by the component(s) of the processing device. For example, if the component is idle for a relatively long time, power supplied to the component may be gated, reducing stand-by and leakage power consumption. However, transitioning a processing device or its components between different sleep states has important ramifications on the energy consumed by the processing device and the processing device's performance. For example, transitioning into or out of a sleep state from either the active state or a deeper sleep state level imposes a performance cost due to the delay caused by the transition. An energy cost may also be incurred due to operations that are to be performed before the transition. A performance cost is also incurred to return the processor core to an active state from a deep sleep level state in which the component is power-gated. Therefore, a deeper sleep state is more efficient than a shallower sleep state only if a component's residency in the deeper sleep state is sufficiently long such that the power savings associated with the deeper sleep state exceed the power consumed during entry and exit transitions to/from the deeper sleep state.

Sleep state management systems/algorithms could benefit from determining the appropriate sleep state level based on the energy-performance break-even cost for a sleep duration. However, a priori knowledge of how long a sleep duration will be for a component is typically not available. Therefore, many conventional sleep state management systems attempt to filter sleep durations that are too short by introducing a hysteresis duration before saving the states of the components being placed in a sleep state. Introducing a hysteresis duration usually results in energy inefficiencies because the hysteresis duration is typically too long (e.g., order of milliseconds). The sleep durations for many types of workloads are generally within the sub-millisecond range, with occasional longer sleep durations lasting within the millisecond range. Therefore, long entry hysteresis results in shorter sleep durations (e.g., sub-millisecond) being disregarded and a deeper sleep state being entered for every single sleep request (zero entry hysteresis). Also, conventional sleep state management systems usually have many tunable parameters, a non-adaptive approach to sleep state entry, lack a framework for future improvement/expansion, and may be controlled by operating system power management algorithms. All of these characteristics further add to the inefficiencies of conventional sleep state management systems.

The present disclosure describes embodiments of systems and methods for improving a processing device's energy efficiency by transitioning components into deeper sleep states directly instead of consuming energy in entry hysteresis periods. As described in greater detail below, sleep state durations of the processing device and components thereof are monitored and recorded to generate historical sleep state duration information. The historical sleep duration information is used to predict an upcoming sleep state duration of a component. A break-even duration is determined for one or more sleep states available for the component. The break-even duration indicates a sleep-state duration for which the benefits of transitioning into the sleep state exceed the costs of transitioning into the sleep state. The predicted sleep duration is compared to the break-even duration determined for the one or more sleep states, and a sleep state for the component is selected based on this comparison. The component is then transitioned into the selected sleep state. In at least some embodiments, the component's current sleep state is promoted to a deeper sleep state if the component has resided within the current sleep state for a duration that satisfies one or more sleep state duration thresholds. A decision error feedback mechanism, in at least some embodiments, is implemented to adjust subsequently predicted sleep durations to reduce errors in sleep state selections based thereon. Also, in at least some embodiments, information such as Latency Tolerance Report (LTR) values from input/output devices (e.g., peripheral component interconnect express (PCIe) devices, universal serial bus (USB) devices, etc.) or timer values for Advanced Programmable Interrupt Controller (APIC) interrupts are used in addition to the predicted sleep duration to select a sleep state for a component.

FIG. 1 is a block diagram of an example processing device 100 in which the power state management techniques described herein can be implemented. In at least some embodiments, the processing device 100 includes, for example, a computer, a mobile device, a gaming device, a tablet computing device, a wearable computing device, a set-top box, a television, or another type of computing system or device. The processing device 100, in at least some embodiments, comprises a processor 102, memory 104, storage 106, one or more input devices 108, and one or more output devices 110. The processing device 100, in at least some embodiments, also comprises an input driver 112 and an output driver 114. It should be understood that the processing device 100 can include additional components not shown in FIG. 1.

In at least some embodiments, the processor 102 comprises a central processing unit (CPU), a graphics processing unit (GPU), a CPU and GPU located on the same die or multiple dies (e.g., using a multi-chip-module (MCM)), or one or more processor cores, wherein each processor core is a CPU or a GPU. The memory 104, in at least some embodiments, is located on the same die as the processor 102 or is located separately from the processor 102. The memory 104 includes a volatile or non-volatile memory, such as random-access memory (RAM), dynamic RAM, cache, and so on.

The storage 106, in at least some embodiments, comprises a fixed or removable storage, such as a hard disk drive, a solid-state drive, an optical disk, a flash drive, and so on. In at least some embodiments, the input devices 108 comprise, for example, one or more of a keyboard, a keypad, a touch screen, a touchpad, a detector, a microphone, an accelerometer, a gyroscope, a biometric scanner, a network connection (e.g., a wireless local area network card for transmission/reception of wireless signals), and so on. The output devices 110, in at least some embodiments, comprise, for example, one or more of a display, a speaker, a printer, a haptic feedback device, one or more lights, an antenna, or a network connection (e.g., a wireless local area network card for transmission/reception of wireless signals), and so on.

In at least some embodiments, the input driver 112 communicates with the processor 102 and the input devices 108 and allows the processor 102 to receive input from the input devices 108. The output driver 114, in at least some embodiments, communicates with the processor 102 and the output devices 110 and allows the processor 102 to send output to the output devices 110. It is noted that the processing device 100 operates in the same manner if the input driver 112 and the output driver 114 are not present. The output driver 114, in at least some embodiments, includes an accelerated processing device (APD) 116 that is coupled to a display device 118. The APD accepts compute commands and graphics rendering commands from processor 102, processes those compute and graphics rendering commands, and provides pixel output to display device 118 for display. As described in further detail below, the APD 116 includes one or more parallel processing units that perform computations in accordance with a single-instruction-multiple-data (SIMD) paradigm. Thus, although various functionality is described herein as being performed by or in conjunction with the APD 116, in other embodiments, the functionality described as being performed by the APD 116 is additionally or alternatively performed by other computing devices having similar capabilities that are not driven by a host processor (e.g., processor 102) and provides graphical output to a display device 118. For example, in at least some embodiments, any processing system that performs processing tasks in accordance with a SIMD paradigm performs the functionality described herein. Alternatively, in at least some embodiments, computing systems that do not perform processing tasks in accordance with a SIMD paradigm perform the functionality described herein.

Figure 2:
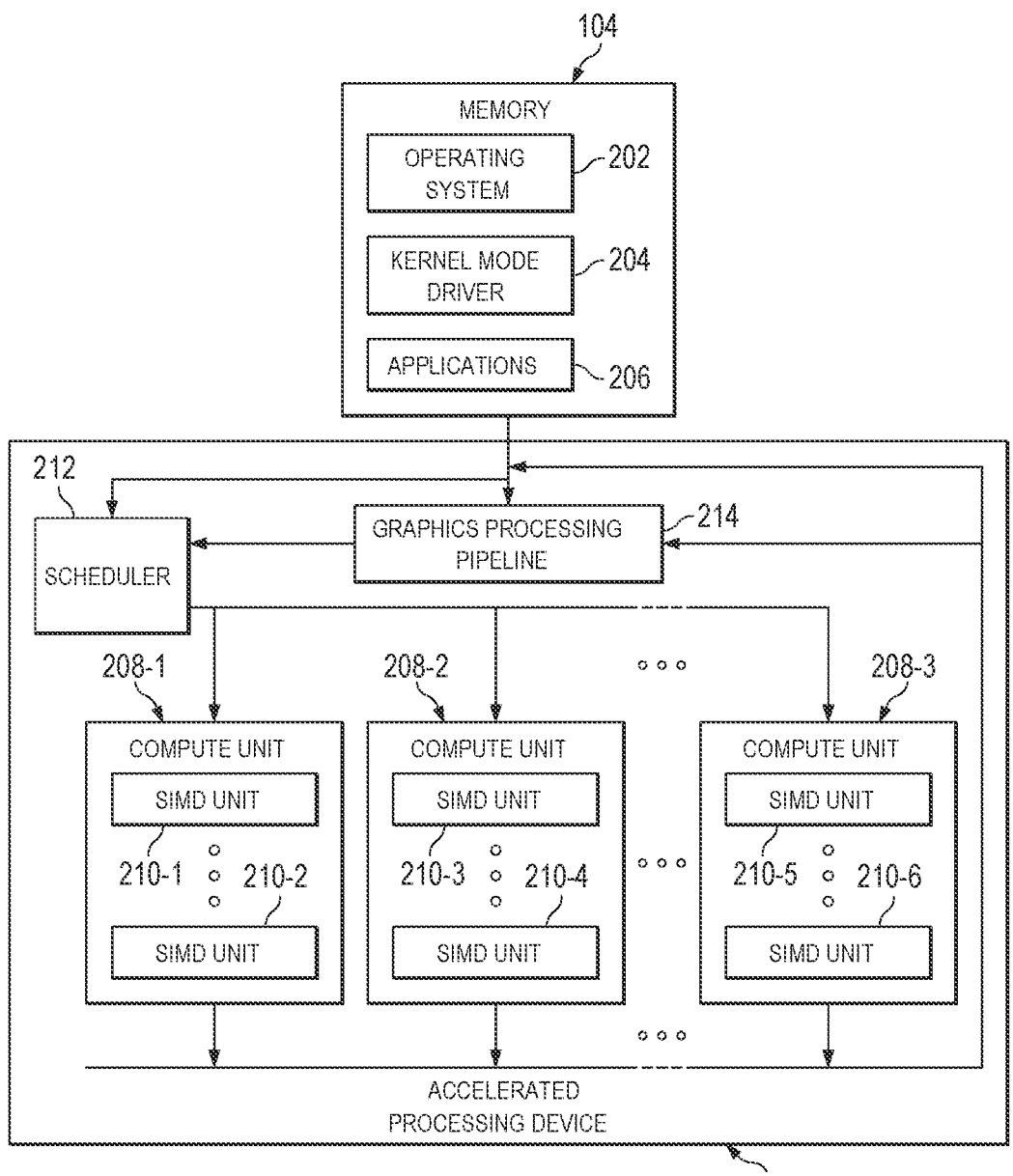
FIG. 2 is a block diagram illustrating additional detail of the processing device of FIG. 1 in accordance with some embodiments.

FIG. 2 is a block diagram of the processing device 100 illustrating additional details related to the execution of processing tasks on the APD 116. In at least some embodiments, the processor 102 maintains, in memory 104, one or more control logic modules for execution by the processor 102. The control logic modules, in at least some embodiments, comprise an operating system 202, a kernel mode driver 204, and applications 206. These control logic modules control various features of the operation of the processor 102 and the APD 116. For example, the operating system 202 directly communicates with hardware and provides an interface to the hardware for other software executing on the processor 102. The kernel mode driver 204 controls operation of the APD 116 by, for example, providing an application programming interface (API) to software (e.g., applications 206) executing on the processor 102 to access various functionality of the APD 116. The kernel mode driver 204, in at least some embodiments, also includes a just-in-time compiler that compiles programs for execution by processing components (such as the SIMD units 210 discussed in further detail below) of the APD 116.

In at least some embodiments, the APD 116 executes commands and programs for selected functions, such as graphics operations and non-graphics operations that may be suited for parallel processing. The APD 116, in at least some embodiments, is used for executing graphics pipeline operations (e.g., pixel operations, geometric computations, etc.) and rendering an image to display device 118 based on commands received from the processor 102. The APD 116 also executes compute processing operations that are not directly related to graphics operations, such as operations related to video, physics simulations, computational fluid dynamics, or other tasks, based on commands received from the processor 102.

The APD 116, in at least some embodiments, comprises compute units 208 (illustrated as 208-1 to 208-3) that include one or more SIMD units 210 (illustrated as 210-1 to 210-6), which perform operations at the request of the processor 102 in a parallel manner according to a SIMD paradigm. The SIMD paradigm is one in which multiple processing elements share a single program control flow unit and program counter and execute the same program but with different data. In one example, each SIMD unit 210 comprises sixteen lanes, where each lane executes the same instruction at the same time as the other lanes in the SIMD unit 210 but can execute that instruction with different data. Lanes can be switched off with predication if not all lanes are to execute a given instruction. Predication can also be used to execute programs with divergent control flow. More specifically, for programs with conditional branches or other instructions where control flow is based on calculations performed by an individual lane, predication of lanes corresponding to control flow paths not currently being executed, and serial execution of different control flow paths allows for arbitrary control flow.

In at least some embodiments, the basic unit of execution in compute units 208 is a work-item. Each work-item represents a single instantiation of a program that is to be executed in parallel in a particular lane. Work-items, in at least some embodiments, are executed simultaneously as a "wavefront" on a single SIMD processing unit 210. One or more wavefronts are included in a "workgroup", which includes a collection of work-items designated to execute the same program. A workgroup is executed by executing each of the wavefronts that make up the workgroup. In other embodiments, the wavefronts are executed sequentially on a single SIMD unit 210 or partially or fully in parallel on different SIMD units 210. Wavefronts, in at least some embodiments, represent the largest collection of work-items that can be executed simultaneously on a single SIMD unit 210. Thus, if commands received from the processor 102 indicate that a particular program is to be parallelized to such a degree that the program cannot execute on a single SIMD unit 210 simultaneously, then that program is broken up into wavefronts which are parallelized on two or more SIMD units 210 or serialized on the same SIMD unit 210 (or both parallelized and serialized). A scheduler 212 performs operations related to scheduling various wavefronts on different compute units 208 and SIMD units 210.

The parallelism afforded by the compute units 208, in at least some embodiments, is suitable for graphics-related operations such as pixel value calculations, vertex transformations, and other graphics operations. Thus, in some instances, a graphics pipeline 214, which accepts graphics processing commands from the processor 102, provides computation tasks to the compute units 208 for execution in parallel.

In at least some embodiments, the compute units 208 are also used to perform computation tasks not related to graphics or not performed as part of the "normal" operation of a graphics pipeline 214 (e.g., custom operations performed to supplement processing performed for operation of the graphics pipeline 214). An application 206 or other software executing on the processor 102 transmits programs that define such computation tasks to the APD 116 for execution.

Figure 3:
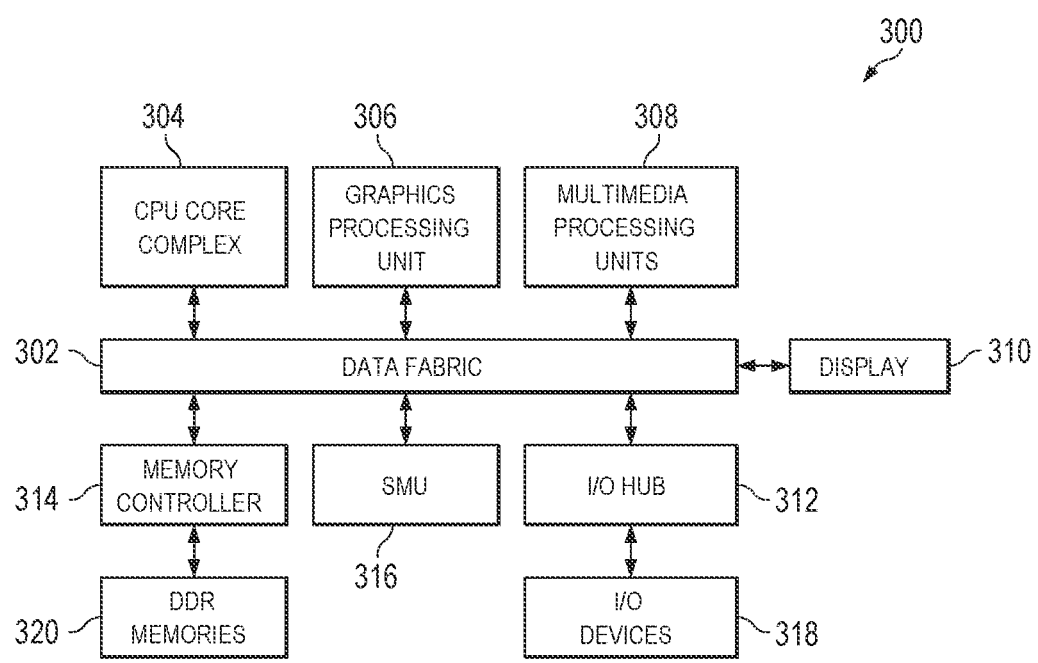
FIG. 3 is a block diagram of an example System-On-Chip device in accordance with some embodiments.

FIG. 3 is a block diagram illustrating another example of a processing device 300 in which the power management techniques described herein can be implemented. In the example shown in FIG. 3, the processing device 300 is a system-on-a-chip (SoC) device 300. In at least some embodiments, the SoC device 300 includes components such as a data fabric 302, CPU core complex 304, GPU 306, multimedia processing units (MPUs) 308, display interface 310, I/O hub 312, memory controller 314, and a system management unit (SMU) 316. One or more of these and other components, in at least some embodiments, are comprised of intellectual property (IP) blocks/cores, which are reusable units of logic, cells, or integrated circuit (IC) layouts.

The data fabric 302, in at least one embodiment, includes circuitry for providing communication interconnections among the various components of the SoC device 300. Any suitable interconnection hardware is used in various implementations. In some implementations, from a physical standpoint, the data fabric 302 is implemented either in a central location of the SoC device or distributed to multiple hubs across the SoC device 300 and interconnected using a suitable communications medium (e.g., a bus). From a logical standpoint, the data fabric 302 is located at the center of data flow, and information regarding the idleness of different components (including IP blocks) of the SoC device 300 is concentrated (e.g., stored) in the data fabric 302. In some implementations, this information is used by the SMU 316 in determining an appropriate time to transition one or more components of the Soc device 300 into a power management state, such as a sleep state.

In at least some embodiments, the CPU core complex 304 includes one or more suitable CPU cores. Each of the cores in a complex, in at least some embodiments, includes a private cache and all of the cores in a complex are in communication with a shared cache. In at least some embodiments, the SoC device 300 includes a plurality of CPU core complexes. The GPU 306, in at least some embodiments, includes any suitable GPU or combination of GPU hardware. The MPUs 308, in at least some embodiments, include one or more suitable MPUs, such as audio co-processors, imaging signal processors, video codecs, and so on.

The display interface 310, in at least some embodiments, includes any suitable hardware for driving one or more displays. The I/O hub 312, in at least some embodiments, includes any suitable hardware for interfacing the data fabric 302 with I/O devices 318. The I/O devices 318, in at least some embodiment, include one or more of a universal serial bus (USB), peripheral component interconnect express (PCIe) bus, non-volatile memory host controller interface (NVMe) bus, serial advanced technology attachment (SATA) bus, gigabit Ethernet (xGBE), inter-integrated circuit (I2C) bus, secure digital (SD) interface, general-purpose input/output (GPIO) connection, sensor fusion I/O connection, and or any other suitable I/O hardware. Accordingly, in at least some embodiments, the I/O hub 312 includes a USB host controller, PCIe root complex, NVMe host controller, SATA host controller, xGBE interface, I2C node, SD host, GPIO controller, sensor fusion controller, and or any other suitable I/O device interfaces.

The memory controller 314, in at least some embodiment, includes any suitable hardware for interfacing with memories 320. The SMU 316, in at least some embodiments, comprises hardware and firmware for managing and accessing system configuration/status registers and memories, generating clock signals, controlling power rail voltages, and enforcing security access and policy for the SoC device 300. In at least some embodiments, the SMU 316 is interconnected with the other blocks of the SoC device 300 using a system management communication network (not shown). The SMU 316, in at least some embodiments, also manages thermal and power conditions of the CPU core complex 304 and other components (including individual IP blocks) of the SoC device 300. As such, the SMU 316 is able to control power supplied to components and sub-components of the SoC device, such as the cores of the CPU core complex 304 and IP blocks. In at least some embodiments, the SMU 316 is also configured to adjust operating points of SoC components (e.g., cores of the CPU core complex 304) by changing an operating frequency or an operating voltage supplied to the components.

In at least some embodiments, the SMU 316 is configured to transition components of the SoC device 300 to/from one or more power management states. It is noted that throughout this description, reference to transitioning a component of the SoC device 300 to/from one or more power management states includes transitioning the entire SOC device 300 and entire component, such as the CPU core complex 304, GPU 306, MPUs 308, I/O hub 312, and so on, or a sub-component of a component, such as a core of the CPU core complex 304 or an IP block. Examples of power management states include an active state and one or more sleep states, such as idle and power-gated states. Sleep states can also be referred to as low power or lower power states. In an active state, a component executes instructions and runs at a nominal operating frequency and operating voltage. In a sleep state, a component does not typically execute or operate on instructions and can be run at a lower operating frequency/voltage. A component can also be power-gated in a sleep state such that power supply is disconnected from the component. For example, the SMU 316 issues signals or instructions to gate logic connected to a power supply. In this example, the gate logic controls the power supplied to the component and gates the power by opening one or more circuits to interrupt the flow of current to the component. In at least some embodiments, multiple levels of sleep states are implemented. As the sleep state level increases, less power is consumed by the component than the previous sleep state level(s). The lowest sleep state level can be referred to as the shallowest sleep state, and the highest sleep state level can be referred to as the deepest sleep state. A shallower sleep state is a lower power sleep state than a deeper (higher power) sleep state. By transitioning a component to one or more sleep states, power can be conserved.

Although deeper sleep states may conserve more power than shallower sleep states, the deeper sleep states typically impose a performance and power penalty in the transition durations. For example, consider a set of sleep states S={S1, S2, S3, . . . , Sn), where Sn is the deepest sleep state supported by the platform. For a component to enter the third sleep state S3, the component typically first enters the first sleep state S1 and then transition to the second sleep state S2 before entering the third sleep state S3 due to the logical sequence of powering down the component and its sub-components. Similarly, to transition out of the third sleep state S3 to the active state, the component typically is to sequentially transition from the third sleep state S3 to the second sleep state S2, and then from the second sleep state S2 to the first sleep state S1 before entering the active state. Entering each one of these sequential sleep states consumes both time and power. In more detail, transitions to and from each sleep state involve various actions to be taken by the SMU 316, which require extra time and power for such transitions. Deeper sleep states require a greater number of (or more resource-intensive) actions for entry and exit than shallower sleep states. Also, deeper sleep states typically take longer to recover to the active/working state than in a shallower sleep state and, therefore, incur a greater latency penalty.

In at least some embodiments, the SMU 316 implements a rapid sleep state transition mode for transitioning a component into a sleep state. As described in greater detail below, the SMU 316 selects a sleep state for a component of the SoC device 300 based on a predicted sleep state duration and a determined break-even duration at which the benefits of transitioning into the sleep state exceed (or at least equal) the costs of transitioning into the sleep state. The SMU 316 compares the predicted sleep duration to the break-even duration for one or more sleep states. Based on this comparison, the SMU 316 determines if the component's residency in a deeper sleep state is sufficiently long that power savings associated with the deeper sleep state exceed (or at least equal) the power consumed during entry and exit transitions to/from the deeper sleep state. If the predicted sleep duration satisfies the determined break-even duration for the deeper sleep state, the SMU 316 transitions the component into the deeper sleep state. However, if the predicted sleep duration does not satisfy the determined break-even duration for the deeper sleep state, the SMU 316 transitions the component into a shallower sleep state.

As such, the rapid sleep state mode of the SMU 316 improves energy efficiency of the device because the SMU 316 is able to transition a component into deeper sleep states directly instead of consuming energy in entry hysteresis periods. In at least some embodiments, the rapid sleep state transition mode can be enabled or disabled by a hardware or software component of the SoC device 300 or another device coupled to the SoC device 300. If the rapid sleep state transition mode is disabled, conventional power state management operations can be implemented by the SMU 316. In at least some embodiments, a bit can be stored in a register, such as a model-specific register (MSR), to inform other hardware, software, or an operating system whether the rapid sleep state transition mode is enabled or disabled.

Figure 4:
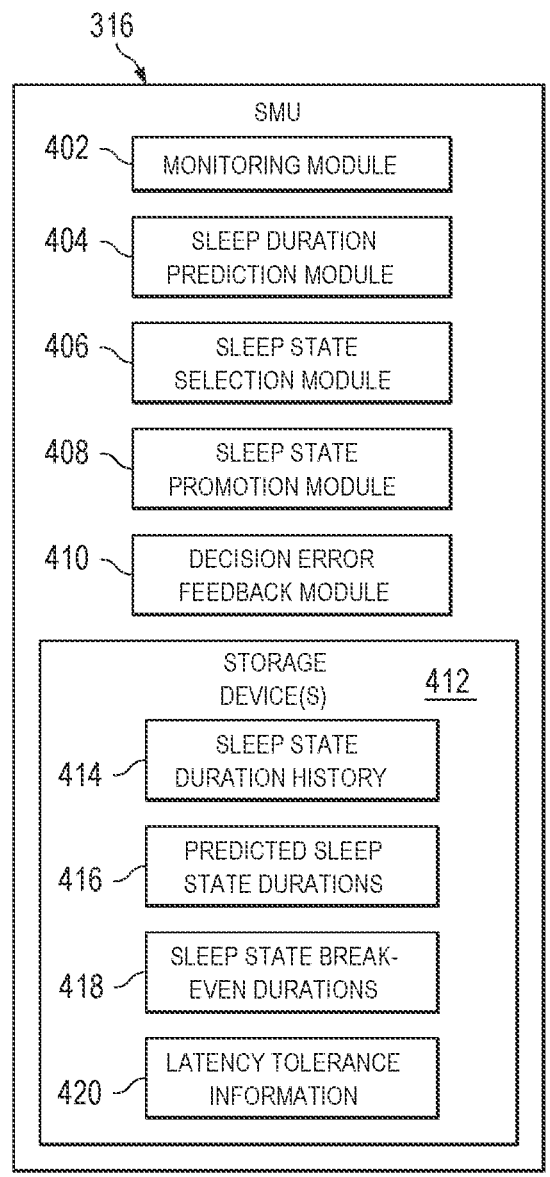
FIG. 4 is a block diagram of an example system management unit in accordance with some embodiments.

FIG. 4 is a block diagram illustrating a more detailed view of the SMU 316 according to at least some embodiments. It is noted that although the SMU 316 is described herein as being implemented by the SoC device 300, the SMU 316 may also be implemented by the processing device 100 of FIG. 1. In the example shown in FIG. 4, the SMU 316 comprises a monitoring module 402, a sleep duration prediction module 404, a sleep state selection module 406, a sleep state promotion module 408, a decision error feedback module 410, and one or more storage devices 412. It is noted that, in at least some embodiments, one or more of these components are implemented in another component of the SoC device 300 (or processing device 100) different from the SMU 316, such as a central microcontroller, an individual IP management controller, and so on.

The monitoring module 402, in at least some embodiments, monitors and records the sleep state durations of components of the SoC device 300. In at least some embodiments, a sleep state duration ($\tau$) for a component is defined as the time (duration) between the SMU 316 receiving the lowest level sleep state (e.g., sleep state S0) interrupt and receiving any wake event for the component. Stated differently, a sleep state duration for a component is the time between initiation of a first transition (which can include an entry hysteresis) during which component is transitioned from an active state to a sleep state and initiation of a second transition during the component is transitioned out of the sleep state back to the active state. It is noted that, in other embodiments, a sleep state duration is defined using different parameters. In at least some embodiments, the monitoring module 402 uses one or more internal timers to record the components' sleep state durations.

The monitoring module 402, in at least some embodiments, records/stores the sleep state durations as historical duration information 414 in the one or more storage devices 412. In at least some embodiments, the one or more storage devices 412 reside locally within the SMU 316, remotely from the SMU 316, or a combination thereof. The historical duration information 414, in at least some embodiments, is stored on a device level, a component level, sub-component, level, a combination thereof, or so on. If the historical duration information 414 is recorded and stored on a device level, entries for the past n sleep state durations across all components of the SoC device 300 are stored. For example, if n=32, then the historical duration information 414, in this example, comprises entries for the previous 32 sleep state durations associated with any of the components of the SoC device 300. If the historical duration information 414 is recorded and stored on a component or sub-component level, each component or sub-component is associated with its own historical duration entries. For example, if n=32, then the historical duration information 414, in this example, comprises entries for the previous 32 sleep durations of a first component, entries for the previous 32 sleep state durations for a second component, and so on. In at least some embodiments, each component or sub-component is associated with a separate data structure comprising the historical duration information 414 associated therewith. In at least some embodiments, the number of previous sleep state durations recorded by the monitoring module 402 is configurable.

The sleep duration prediction module 404, in at least some embodiments, utilizes the historical duration information 414 to predict the duration of an upcoming sleep state. For example, if the SMU 316 determines that a given component is idle, the sleep duration prediction module 404 processes the historical duration information 414 to predict the duration of the upcoming sleep state for the component. In at least some embodiments, the sleep duration prediction module 404 stores the predicted sleep state duration 416 in the one or more storage devices 412.

The sleep state selection module 406, in at least some embodiments, determines the appropriate sleep state for a component of the SoC device 300. In at least some embodiments, the sleep state selection module 406 selects a sleep state from a plurality of sleep states resulting in the least amount of energy being consumed while having the least performance impact (herein referred to as the selection criteria). The sleep state selection module 406, in at least some embodiments, identifies the sleep state satisfying the selection criteria based on the predicted sleep state duration 416 and a sleep state break-even duration 418, also referred to as break-even duration 418 or break-even threshold 418. The break-even duration 418 for a sleep state indicates the amount of time the component is to stay in the sleep state such that the energy saved by residing in the sleep state at least equals the energy cost to transition in and out of the sleep state. For example, the break-even duration 418 for sleep state S2 indicates the amount of time the component is to stay in sleep state S2 such that the energy saved by residing in sleep state S2 at least equals the energy cost to transition in and out of the sleep state S2.

The sleep state selection module 406, in at least some embodiments, stores the break-even duration 418 in the one or more storage devices 412. In at least some embodiments, the sleep state selection module 406 also uses latency tolerance information 420 associated with one or more input/out devices 318 (e.g., PCIe devices, USB devices, etc.), APIC interrupt timer values, or a combination thereof to select the sleep state for a component. The latency tolerance information 420, in at least some embodiments, indicates the busy level of the input/out devices 318. The APIC interrupt timer values indicate the time to the next APIC interrupt. When the sleep state has been selected, the SMU 316 proceeds to transition the component to the selected sleep state by performing one or more actions (e.g., flushing caches, clock gating powering down voltage rails, and so on).

The sleep state promotion module 408, in at least some embodiments, performs corrective actions if a determination is made that an incorrect (less efficient) sleep state was selected by the sleep state selection module 406. For example, the sleep state promotion module 408 monitors the component while in a selected sleep state and determines if the component has resided in the selected sleep state longer than a given threshold. If so, the sleep state promotion module 408, in at least some embodiments, transitions the component to the next deeper sleep state.

The decision error feedback module 410, in at least some embodiments, monitors the sleep state decisions made by the sleep state selection module 406 to detect errors. Examples of detected errors include selecting a shallower sleep state when a deeper sleep should have been selected or selecting a deeper sleep state when a shallower sleep state should have been selected. Incorrect sleep state selection is a result of, for example, an incorrect sleep duration prediction. Therefore, in at least some embodiments, the decision error feedback module 410 provides input to sleep duration prediction module 404 such that the sleep duration prediction module 404 adjusts its subsequent sleep duration predictions to reduce sleep state selection errors.

Figure 5:
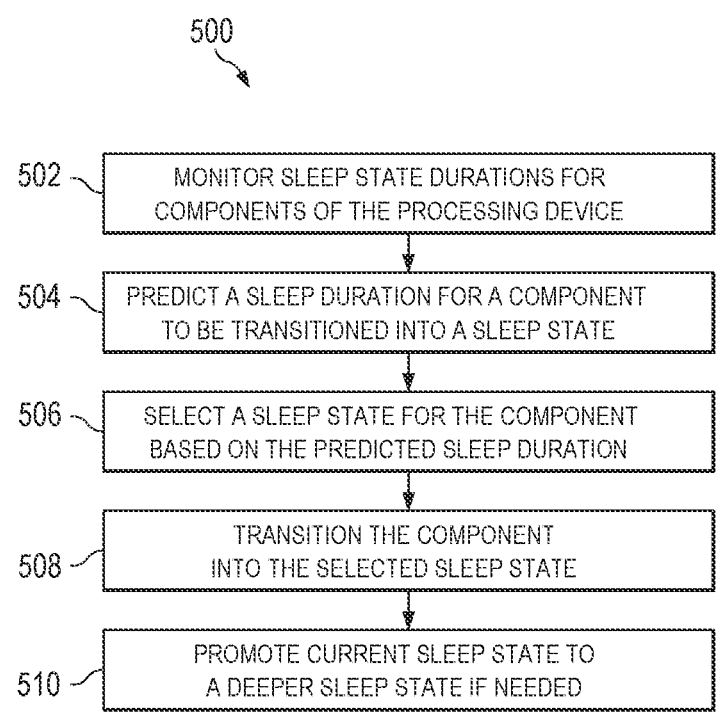
FIG. 5 is a flow diagram illustrating an overall example method of transitioning components of a processing device directly into deeper sleep states in accordance with some embodiments.

FIG. 5 illustrates, in flow chart form, an overview of one example method 500 for improving energy efficiency of a processing device by transitioning components into deeper sleep states directly instead of consuming energy in entry hysteresis periods. The monitor module 402, at block 502, monitors sleep state durations for components of the SoC device 300. The sleep duration prediction module 404, at block 504, predicts a sleep duration for a component of the SoC device 300 to be transitioned into a sleep state. The sleep state selection module 406, at block 506, selects a sleep state for the component based on the predicted sleep duration. The SMU 316, at block 508, transitions the component into the selected sleep state. In at least some embodiments, the sleep state promotion module 408, at block 510, promotes the current sleep state of the component to a deeper sleep state.

Figure 6:
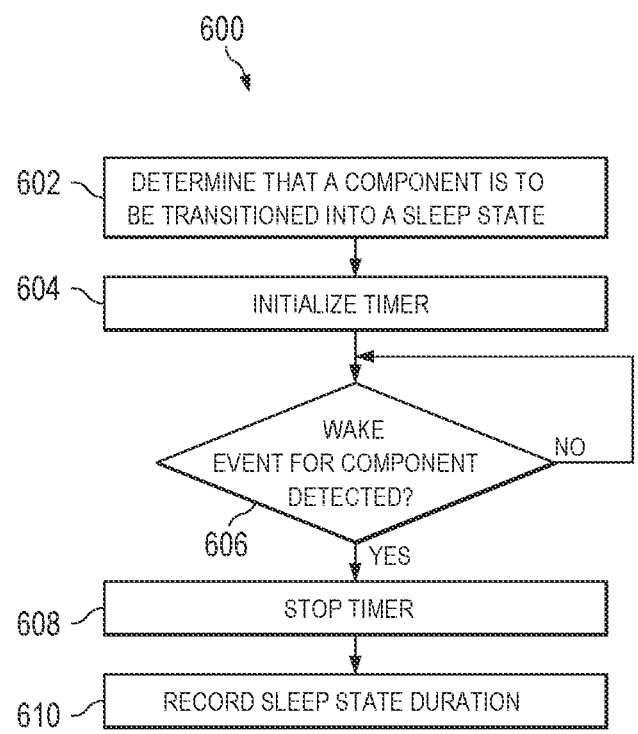
FIG. 6 is a flow diagram illustrating a more detailed method for the duration monitoring process illustrated in block 502 of FIG. 5 in accordance with some embodiments.

FIG. 6 illustrates, in flow chart form, one example of a more detailed method 600 for the sleep state duration monitoring process illustrated in block 502 of FIG. 5. In at least some embodiments, the monitoring module 402, block 602, is invoked based on a determination being made that a component of the SoC device 300 is to be transitioned into a sleep state. For example, the SMU 316 receives or detects an interrupt indicating that one or more components of the SoC device 300 are idle. One or more timers, at block 604, are initialized based on determining that the component is to be transitioned into a sleep state. A determination is made, at block 606, whether a wake event has been detected/received for the component. If a wake event has not been detected, the monitoring module 402 maintains the timer(s) until a wake event is detected. If a wake event has been detected for the component, the timer(s) is stopped at block 608. In at least some embodiments, the recorded time between the SMU 316 receiving a sleep state request interrupt and receiving the wake event for the component is referred to as the sleep state duration of the component. However, other configurations for the sleep duration are applicable as well.

In at least some embodiments, if the sleep state of the component is a deeper sleep state, the sleep state duration not only includes a duration of time the component resided in the deeper sleep state but also the time spent transitioning the component through the shallower sleep states. For example, consider a list of sleep states S=(S1, S2, . . . , Sn), where Sn is the deepest sleep state supported by the component of the SoC device 300. The component typically enters the first enter sleep state S1 before entering the deeper sleep state S2 due to the logical sequence of powering down the component or its sub-components. Therefore, if sleep state S2 is selected for the component, the component's sleep state duration includes the time the component resides in sleep state S2 and the time spent transitioning the component from the active state through each shallower state. In at least some embodiments, sleep states are associated with an entry hysteresis. In these embodiments, the sleep state duration of a component also includes the hysteresis latency of the sleep state.

Figure 7:
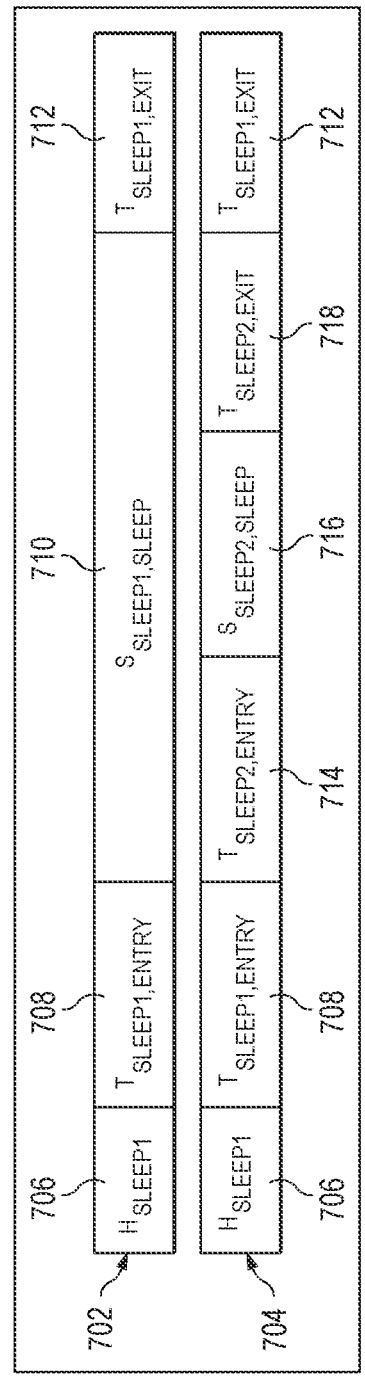
FIG. 7 illustrates example timing sequences for two different sleep states in accordance with some embodiments.

FIG. 7 shows an illustrative example of the timing for transitioning a component of a SoC device 300 into a first sleep state (SLEEP1) and a deeper second sleep state (SLEEP2). In particular, FIG. 7 shows a first timing sequence 702 for transitioning the component into the first sleep state and a second timing sequence 704 for transitioning the component into the deeper second sleep state. In the examples shown in FIG. 7, H corresponds to entry hysteresis latency, which is a delay period before transitioning the component from the active state to the target sleep state; T corresponds to entry and exit latencies, which is the time incurred transitioning the component from one state to another state; and S corresponds to the duration of time the component resided in the target sleep state. In the example shown in FIG. 7, the timing sequence 702 for the first sleep state SLEEP1 includes an entry hysteresis latency 706 ($H_{Sleep1}$), an entry latency 708 ($T_{Sleep1,entry}$), a sleep duration 710 ($S_{Sleep1,sleep}$), and an exit latency 712 ($T_{Sleep1,exit}$). As such, in this example, the sleep state duration τ for the first sleep state is defined as:

$$\tau = H_{sleep1} + T_{sleep1,entry} S_{sleep1,sleep} \quad (EQ\ 1)$$

The timing sequence 704 for the second sleep state SLEEP2 includes the entry hysteresis latency 706 ($H_{Sleep1}$) for the first sleep state, the entry latency 708 ($T_{Sleep1,entry}$) for the first sleep state, an entry latency 714 ($T_{Sleep2,entry}$) for the second sleep state, a sleep duration 716 ($S_{Sleep2,sleep}$) for the second sleep state, an exit latency 718 ($T_{Sleep2,exit}$) for the second sleep state, and the exit latency 712 ($T_{Sleep1,exit}$) for the first sleep state. As such, in this example, the sleep state duration T for the second sleep state is defined as:

$$\tau = H_{sleep1} + T_{sleep1,entry} + T_{sleep2,entry} + S_{sleep2,sleep} \quad (EQ\ 2)$$

Returning now to FIG. 6, the monitor module 402, at block 610, records the sleep state duration determined for the component as historical duration information 414. As described above, the historical duration information 414, in at least some embodiments, is stored on a device level, a component level, sub-component, level, a combination thereof, or so on. In at least some embodiments, if the historical duration information 414 is recorded on a per component or sub-component basis, the components or sub-components communicate their busy/idle status to the SMU 316. Recording duration information 414 on a per-component basis allows the SMU 316 to optimize power for a cluster of components, such as multimedia cores, based on their idle patterns.

Figure 8:
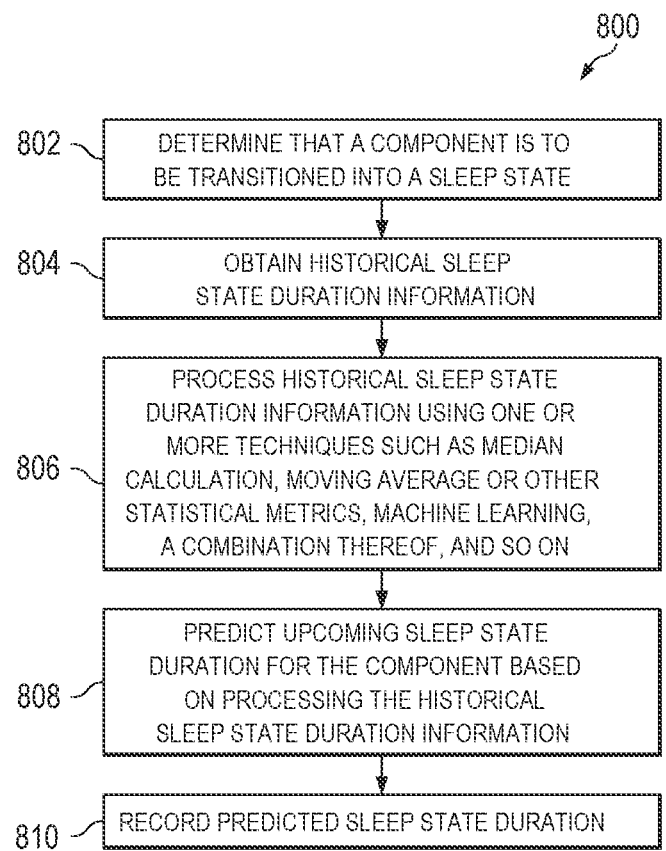
FIG. 8 is a flow diagram illustrating a more detailed method for the duration prediction process illustrated in block 504 of FIG. 5 in accordance with some embodiments.

FIG. 8 illustrates, in flow chart form, one example of a more detailed method 800 for the sleep state duration prediction process illustrated in block 504 of FIG. 5. In at least some embodiments, the sleep duration prediction module 404, block 802, is invoked based on a determination being made that a component of the SoC device 300 is to be transitioned into a sleep state. Historical duration information 414, at block 804, is obtained. In at least some embodiments, historical duration information 414 is obtained for the entire SoC device 300, whereas, in other embodiments, historical duration information 414 is obtained for the component. The historical duration information 414, at block 806, is processed using one or more techniques, such as median calculation, moving average or other statistical metrics, machine learning, a combination thereof, and so on. An upcoming sleep state duration 416 for the component, at block 808, is then predicted based on processing the historical sleep state duration information. For example, consider historical durations D={D1, D2, D3, . . . , DL} where Di represents the duration of the $i^{th}$ sleep in seconds, and L is the total number of sleep durations recorded. In this example, the sleep duration prediction module 404 predicts the upcoming sleep state duration 416 for the component by calculating D_median=median (D) and sends it to the sleep state selection block 506 to decide the appropriate sleep state. The predicted sleep state duration 416 is then stored or transmitted for use by or transmitted to, for example, the sleep state selection module 406.

In at least some embodiments, the SMU 316 implements an error feedback module 410 that provides input to the sleep duration prediction module 404. In these embodiments, the sleep duration prediction module 404 uses feedback input from the error feedback module 410 in addition to the historical duration information 414 to predict an upcoming sleep state duration 416 for a component. The error feedback module 410, in at least some embodiments, monitors the number of incorrect sleep state selections made by the sleep state selection module 406 based on the predicted sleep state duration 416. In one example, a sleep state selection is determined to be incorrect when a deeper sleep state is selected, but the actual sleep state duration of the component was such that a shallower sleep state should have been selected. In another example, a sleep state selection is incorrect when a shallower sleep state is selected, but the actual sleep state duration of the component was such that a deeper sleep state should have been selected. The error feedback module 410 implements one or more mechanisms, such as a proportional-integral-derivative (PID) controller, to provide input, such as corrections, to the sleep duration prediction module 404. The sleep duration prediction module 404 implements the input received from the error feedback module 410 to adjust its prediction operations to provide more accurate predicted sleep state durations 416. For example, the sleep duration prediction module 404 uses the feedback input to adjust one or more parameters for predicting sleep state durations for components of the SoC device 300.

Figure 9:
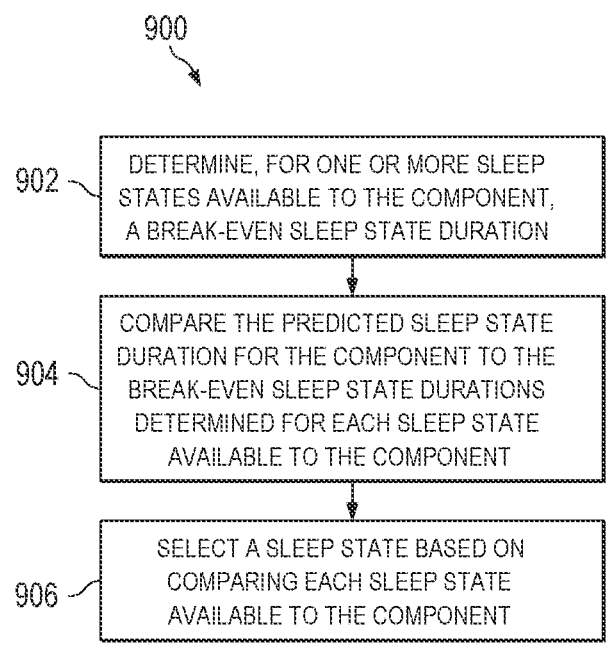
FIG. 9 is a flow diagram illustrating a more detailed method for the sleep state selection process illustrated in block 506 of FIG. 5 in accordance with some embodiments.

FIG. 9 illustrates, in flow chart form, one example of a more detailed method 900 for the sleep state selection process illustrated in block 506 of FIG. 5. In the method 900, a break-even duration 418, at block 902, is determined for one or more sleep states available to the component of the SoC device 300. As described above, the break-even duration 418 for a given sleep state is the amount of time the component is to stay in the sleep state such that the energy saved by residing in the sleep state at least equals the energy consumed by only transitioning to and staying in a shallower sleep state. The energy of a given sleep state, in at least some embodiments, is determined based not only on the given sleep but also on any lower-level sleep state. For example, consider a list of sleep states S=(S1, S2, . . . , Sn), where Sn is the deepest sleep state supported by the component of the SoC device 300. As described above, the component typically enters the first enter sleep state S1 before entering sleep state S2 due to the logical sequence to powering the component or its sub-components. Therefore, in this example, the energy for sleep state S2 is calculated based on (1) the energy required to enter sleep states S1 and S2; (2) the energy required to stay in sleep states S1 and S2; and (3) the energy required to exit sleep states S1 and S2.

For example, referring back to FIG. 7, the sleep state selection module 406 determines the energy (E) for the sleep state SLEEP1 sequence 702 and the SLEEP2 sequence 704 for a given (predicted) sleep state duration τ as follows:

$$E_{sleep\,1} = (H_{sleep\,1} \cdot P_{sleep\,0}) + (T_{sleep\,1,entry} \cdot P_{sleep\,1,entry}) \quad \text{(EQ 3)}$$
$$((\tau - (H_{sleep\,1} + T_{sleep\,1,entry})) \cdot P_{sleep\,1}) + (T_{sleep\,1,exit} \cdot P_{sleep\,1,exit})$$

where $P_{sleep}$ is the power consumed when residing in the corresponding sleep state, $P_{entry}$ is the power consumed during entry of the sleep state, and $P_{exit}$ is the power consumed during exit of the sleep state.

(EQ 4)

$$E_{sleep\,2} = (H_{sleep\,1} P_{sleep\,0}) + (T_{sleep\,1,entry} \cdot P_{sleep\,1,entry}) +$$
$$(T_{sleep\,2,entry} \cdot P_{sleep\,2,entry}) + (\tau - H_{sleep\,1} + T_{sleep\,1,entry} + T_{sleep\,2,entry})) \cdot$$
$$P_{sleep\,2} + (T_{sleep\,2,exit} \cdot P_{sleep\,2,exit}) + (T_{sleep\,1,exit} \cdot P_{sleep\,1,exit})$$

The sleep state selection module 406 determines the break-even duration 418 for a given sleep state based on the energy E calculated for the sleep state and one or more shallower sleep states. For example, in at least some embodiments, the sleep state selection module 406 determines the break-even duration 418 for a given sleep state as the value of τ* when the energy E of the sleep state equals the energy of one or more previous sleep states. Therefore, in the current example, the sleep state selection module 406 calculates the break-even duration (τ*) 418 for sleep state SLEEP2 as the value of τ* when $E_{sleep1} = E_{sleep2}$, according to:

$$\tau^* = \left(\frac{1}{P_{sleep\,1} - P_{sleep\,2}}\right) \cdot ((T_{sleep\,2,entry} \cdot P_{sleep\,2,entry}) - \quad \text{(EQ 5)}$$
$$(H_{sleep\,1} + T_{sleep\,1,entry} + H_{sleep\,2} + T_{sleep\,2,entry}) \cdot P_{sleep\,2} +$$
$$((H_{sleep\,1} + T_{sleep\,1,entry}) \cdot P_{sleep\,1}) + (T_{sleep\,2,exit} \cdot P_{sleep\,2,exit}))$$

Returning now to FIG. 9, the predicted sleep state duration 416 of the component, at block 904, is compared to the break-even duration 418 determined for one or more of the sleep states available to the component. A sleep state, at block 906, is selected based on this comparison. In at least some embodiments, the deepest sleep state is selected such that the predicted sleep state duration 416 of the component satisfies the break-even duration 418 for the selected sleep state. For example, consider a first sleep state and a deeper second sleep state. In this example, the break-even duration/threshold 418 for the second sleep state is 1.5 milliseconds. Therefore, if the predicted sleep state duration 416 of the component is equal to or, in other embodiments, greater than 1.5 milliseconds, the sleep state selection module 406 selects the deeper second sleep state for the component. However, if the predicted sleep state duration 416 of the component is less than, in other embodiments, equal to 1.5 milliseconds, the sleep state selection module 406 selects the shallower first sleep state for the component. Once the sleep state has been selected for the component, control flows to block 508 of FIG. 5 such that the component is transitioned into the selected sleep state.

In at least some embodiments, the sleep state selection module 406 uses latency tolerance information 420 of input/out devices 318 when selecting a sleep state for the component. Latency tolerance information 420, in at least some embodiments, includes values indicating the busy level of the associated input/out device 318. In one example, a longer value indicates idleness, whereas a shorter value indicates that the input/out device 318 is active. In some embodiments, latency tolerance information 420 is exposed to the sleep state selection module 406 via one or more registers. In addition to Latency tolerance information 420, Advanced Programmable Interrupt Controller (APIC) values, in at least some embodiments, are used by the sleep state selection module 406 when making a sleep state selection. There are multiple APIC timers that, on expiry, issue interrupts to wake the processor. The APIC timer values made available to sleep state selection module 406 indicate the time to the next APIC interrupt. Therefore, the sleep state selection module 406, in at least some embodiments, monitors upcoming mandatory timer interrupts to determine whether an initial sleep state selection should be updated. For example, if the sleep state selection module 406 initially selects a deeper sleep state but the latency tolerance information 420 indicates an active input/output device 318 or an APIC value indicates an interrupt is to be issued within a given time threshold, the sleep state selection module 406 updates its sleep state selection to a shallower sleep state.

Figure 10:
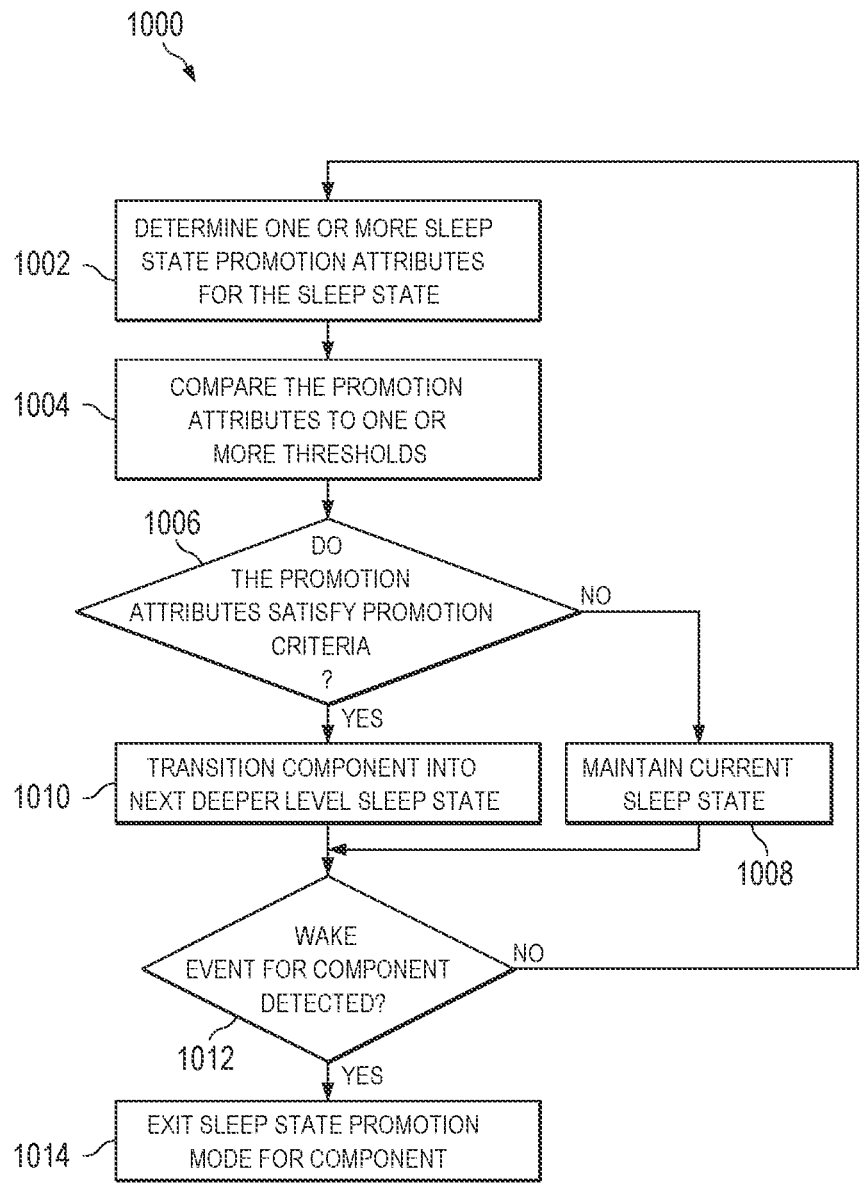
FIG. 10 is a flow diagram illustrating a more detailed method for the sleep state promotion process illustrated in block 510 of FIG. 5 in accordance with some embodiments.

FIG. 10 illustrates, in flow chart form, one example of a more detailed method 1000 for the sleep state promotion process illustrated in block 510 of FIG. 5. In the method 1000, one or more sleep state promotion attributes, at block 1002, are determined for the sleep state of the component. For example, the amount of time (current sleep state duration) the component has been residing in the selected sleep state is determined. In at least some embodiments, the sleep state promotion module 408 uses one or more timers to determine the component's current sleep state duration. In another example, a percentage or number of long sleep durations within the historical duration information 414 is identified. A long sleep duration, in at least some embodiments, is a sleep duration that exceeds a given sleep duration threshold. The one or more sleep state promotion attributes, at block 1004, are compared to sleep state promotion criteria. A determination is made, at block 1006, whether the one or more sleep state promotion attributes satisfy the sleep state promotion criteria. For example, a determination is made whether the current sleep state duration of the component is greater than or equal to a threshold amount of time. In another example, a first determination is made whether the current sleep state duration of the component is greater than or equal to the threshold amount of time, and a second determination is made whether the percentage/number of long sleep durations is greater than or equal to a threshold percentage/number.

If the one or more sleep state promotion attributes do not satisfy the sleep state promotion criteria, the current sleep state is maintained (i.e., the sleep state is not promoted) at block 1008. Control then flows to block 1012. However, if the one or more sleep state promotion attributes satisfy the sleep state promotion criteria, the component, at block 1010, is transitioned from the current sleep state into at least the next deeper sleep state. A determination is made, at block 1012, whether a wake event has been detected for the component. If a wake event for the component has not been detected, the control flow returns to block 1002. However, if a wake event has been detected, the sleep state promotion mode for the component is exited at block 1014.

The power management techniques described herein improve energy efficiency of a processing device by transitioning components into deeper sleep states directly instead of consuming energy in entry hysteresis periods. The various embodiments described herein implement fewer tunable parameters to reduce post-silicon bring up time/complexity, provide increased performance across a range of workloads by being workload adaptive, allow for future expansion/improvement by making the sleep state prediction system/algorithm modular, and untether the prediction system/algorithm from operating system hints.

In some embodiments, the apparatus and techniques described above are implemented in a system including one or more integrated circuit (IC) devices (also referred to as integrated circuit packages or microchips). Electronic design automation (EDA) and computer-aided design (CAD) software tools, in at least some embodiments, are used in the design of the standard cells and the design and fabrication of IC devices implementing the standard cells. These design tools typically are represented as one or more software programs. The one or more software programs include code executable by a computer system to manipulate the computer system to operate on code representative of circuitry of one or more IC devices to perform at least a portion of a process to design or adapt a manufacturing system to fabricate the circuitry. This code, in at least some embodiments, includes instructions, data, or a combination of instructions and data. The software instructions representing a design tool or fabrication tool typically are stored in a computer-readable storage medium accessible to the computing system. Likewise, the code representative of one or more phases of the design or fabrication of an IC device, in at least some embodiments, is stored in and accessed from the same computer-readable storage medium or a different computer-readable storage medium.

A computer-readable storage medium, in at least some embodiments, includes include any non-transitory storage medium or combination of non-transitory storage media accessible by a computer system during use to provide instructions and or data to the computer system. Such storage media, in at least some embodiments, includes, but is not limited to, optical media (e.g., compact disc (CD), digital versatile disc (DVD), Blu-ray disc), magnetic media (e.g., floppy disc, magnetic tape, or magnetic hard drive), volatile memory (e.g., random access memory (RAM) or cache), non-volatile memory (e.g., read-only memory (ROM) or Flash memory), or microelectromechanical systems (MEMS)-based storage media. The computer-readable storage medium, in at least some embodiments, is embedded in the computing system (e.g., system RAM or ROM), fixedly attached to the computing system (e.g., a magnetic hard drive), removably attached to the computing system (e.g., an optical disc or Universal Serial Bus (USB)-based Flash memory) or coupled to the computer system via a wired or wireless network (e.g., network accessible storage (NAS)).

In some embodiments, certain aspects of the techniques described above are implemented by one or more processors of a processing system executing software. The software includes one or more sets of executable instructions stored or otherwise tangibly embodied on a non-transitory computer-readable storage medium. The software, in at least some embodiments, includes the instructions and certain data that, when executed by the one or more processors, manipulate the one or more processors to perform one or more aspects of the techniques described above. The non-transitory computer-readable storage medium, in at least some embodiments, includes, for example, a magnetic or optical disk storage device, solid-state storage devices such as Flash memory, a cache, random access memory (RAM), or other non-volatile memory device or devices, and the like. The executable instructions stored on the non-transitory computer-readable storage medium, in at least some embodiments, is in source code, assembly language code, object code, or other instruction format that is interpreted or otherwise executable by one or more processors.

Note that not all of the activities or elements described above in the general description are required, that a portion of a specific activity or device may not be required, and that one or more further activities may be performed, or elements included, in addition to those described. Still further, the order in which activities are listed is not necessarily the order in which they are performed. Also, the concepts have been described with reference to specific embodiments. However, one of ordinary skill in the art appreciates that various modifications and changes can be made without departing from the scope of the present disclosure as set forth in the claims below. Accordingly, the specification and figures are to be regarded in an illustrative rather than a restrictive sense, and all such modifications are intended to be included within the scope of the present disclosure.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims. Moreover, the particular embodiments disclosed above are illustrative only, as the disclosed subject matter may be modified and practiced in different but equivalent manners apparent to those skilled in the art having the benefit of the teachings herein. No limitations are intended to the details of construction or design herein shown, other than as described in the claims below. It is therefore evident that the particular embodiments disclosed above may be altered or modified, and all such variations are considered within the scope of the disclosed subject matter. Accordingly, the protection sought herein is as set forth in the claims below.

What is claimed is:

1. A method comprising:
    transitioning a component of a processing device into a first sleep state selected from a plurality of sleep states based on a comparison of a predicted sleep state duration for the component to at least one duration threshold, wherein the predicted sleep state duration is based on at least feedback associated with one or more previous selections of a sleep state; and transitioning the component from the first sleep state into a second sleep state of the plurality of sleep states based on a duration of time the component has resided in the first sleep state.

2. The method of claim 1, wherein the second sleep state is a lower power state than the first sleep state.

3. The method of claim 1, wherein:

transitioning the component into at least one of the first sleep state or the second sleep state comprises transitioning the component without an entry hysteresis delay.

4. The method of claim 1, wherein the predicted sleep state duration is predicted based on historical sleep state duration information.

5. The method of claim 4, wherein the historical sleep state duration information comprises durations of previous sleep states associated with the processing device.

6. The method of claim 1, wherein the at least one duration threshold indicates a duration of time the component is to reside within a sleep state associated with the at least one duration threshold such that energy saved by residing in the sleep state at least equals energy costs of transitioning the component to and from the sleep state.

7. The method of claim 1, wherein selecting the first sleep state comprises:

determining the predicted sleep state duration fails to satisfy the at least one duration threshold; and in response to the predicted sleep state duration failing to satisfy the at least one duration threshold, selecting the first sleep state, wherein the first sleep state is a higher power state than at least a third sleep state of the plurality of sleep states.

8. The method of claim 1, wherein selecting the first sleep state comprises:

determining the predicted sleep state duration satisfies the at least one duration threshold; and in response to the predicted sleep state duration satisfying the at least one duration threshold, selecting the first sleep state, wherein the first sleep state is a lower power state than at least the second sleep state.

9. The method of claim 1, further comprising:

receiving feedback indicating one or more incorrect selections of a sleep state were previously made; and in response to receiving the feedback adjusting one or more parameters used to predict sleep state durations for components of the processing device.

10. The method of claim 1, further comprising:

determining that an interrupt associated with the component is to be issued within a threshold amount of time; and in response to determining that an interrupt associated with the component is to be issued within the threshold amount of time, selecting a third sleep state from the plurality of sleep states, wherein the third sleep state is a higher power state than at least the first sleep state.

11. The method of claim 1, wherein transitioning the component from the first sleep state into the second sleep state comprises:

determining the duration of time the component has currently resided in the first sleep state;

comparing the duration of time to a threshold amount of time; and transitioning the component into the second sleep state based on the duration of time satisfying the threshold amount of time, wherein the second sleep state is a lower power state than the first sleep state.

12. The method of claim 1, wherein transitioning the component from the first sleep state into the second sleep state comprises:

determining the duration of time the component has currently resided in the first sleep state;

determining a percentage of sleep state durations in a set of historical sleep state durations associated with the processing device that satisfy a threshold duration of time;

comparing the duration of time to a threshold amount of time;

comparing the percentage of sleep state durations to a threshold percentage; and transitioning the component into the second sleep state based on the duration of time satisfying the threshold amount of time and the percentage of sleep state durations satisfying the threshold percentage, wherein the second sleep state is a lower power state than the first sleep state.

13. A processing device comprising:

a component; and a system management circuit to:

predict a sleep state duration for the component based on at least feedback associated with one or more previous selections of a sleep state; and transition the component into a first sleep state selected from a plurality of sleep states based on a comparison of the predicted sleep state duration to at least one duration threshold, and to transition the component from the first sleep state into a second sleep state of the plurality of sleep states based on a duration of time the component has resided in the first sleep state.

14. The processing device of claim 13, wherein the component is one of:

a central processing unit (CPU);

a graphics processing unit (GPU);

an accelerated processing unit (APU); or a sub-component of one of the CPU, the GPU, or the APU.

15. The processing device of claim 13, wherein the system management circuit is further to transition the component into at least one of the first sleep state or the second sleep state without an entry hysteresis delay.

16. The processing device of claim 13, wherein the sleep state duration is predicted based on historical sleep state duration information comprising durations of previous sleep states associated with the processing device.

17. The processing device of claim 13, wherein the system management circiut is further to select the first sleep state from the plurality of sleep states by:

determining the predicted sleep state duration fails to satisfy the at least one duration threshold; and in response to the predicted sleep state duration failing to satisfy the at least one duration threshold, selecting the first sleep state, wherein the first sleep state is a higher power state than at least a third sleep state of the plurality of sleep states.

18. The processing device of claim 13, wherein the system management circuit is further to select the first sleep state from the plurality of sleep states by:

determining the predicted sleep state duration satisfies the at least one duration threshold; and in response to the predicted sleep state duration satisfying the at least one duration threshold, selecting the first sleep state, wherein the first sleep state is a lower power state than at least the second sleep state.

19. The processing device of claim 13, wherein the system management circuit is further to:

obtain feedback that one or more incorrect sleep state selections have been made; and adjust one or more parameters used to predict sleep state durations for components of the processing device based on the feedback.

20. A processing device comprising:

a component; and a system management circuit to:

monitor a duration of a first sleep state of the component;

obtain error feedback regarding the first sleep state based on the monitored duration; and transition the component from the first sleep state to a second sleep state selected from a plurality of sleep states based on the error feedback.

21. The processing device of claim 20, wherein the component is one of:

a central processing unit (CPU);

a graphics processing unit (GPU);

an accelerated processing unit (APU); or a sub-component of one of the CPU, the GPU, or the APU.

22. The processing device of claim 20, wherein the error feedback indicates that one or more incorrect sleep state selections have been made, and wherein the system management circuit adjusts one or more parameters used to predict sleep state durations for components of the processing device based on the error feedback.

* * * * *